(12) United States Patent
Chien

(10) Patent No.: US 10,991,651 B1
(45) Date of Patent: Apr. 27, 2021

(54) INTERCONNECTION STRUCTURE HAVING REDUCED CAPACITANCE AND METHOD OF MANUFACTURING THE SAME

(71) Applicant: NANYA TECHNOLOGY CORPORATION, New Taipei (TW)

(72) Inventor: Da-En Chien, New Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/808,041

(22) Filed: Mar. 3, 2020

(51) Int. Cl.
  *H01L 23/522* (2006.01)
  *H01L 23/64* (2006.01)
  *H01L 21/768* (2006.01)

(52) U.S. Cl.
  CPC .... *H01L 23/5222* (2013.01); *H01L 21/76838* (2013.01); *H01L 23/5228* (2013.01); *H01L 23/642* (2013.01)

(58) Field of Classification Search
  CPC ......... H01L 21/76838; H01L 21/76841; H01L 21/7682; H01L 2221/1042; H01L 2221/1047
  See application file for complete search history.

(56) References Cited

U.S. PATENT DOCUMENTS

| | | | | |
|---|---|---|---|---|
| 5,847,464 A | * | 12/1998 | Singh | H01L 21/31 257/752 |
| 9,653,348 B1 | * | 5/2017 | Wu | H01L 23/5222 |
| 2014/0232000 A1 | * | 8/2014 | Huang | H01L 21/7682 257/761 |
| 2015/0380272 A1 | * | 12/2015 | Wu | C23C 16/16 438/653 |
| 2016/0372415 A1 | * | 12/2016 | Siew | H01L 21/7682 |

\* cited by examiner

*Primary Examiner* — Peniel M Gumedzoe
(74) *Attorney, Agent, or Firm* — Muncy, Geissler, Olds & Lowe, P.C.

(57) ABSTRACT

The present disclosure provides a semiconductor component including a substrate, a plurality of metallic lines, a passivation layer and a spacer. The metallic lines are disposed on the substrate, the passivation layer is disposed over the substrate and the metallic lines, and the spacer is interposed between the substrate and the dielectric layer and between the metallic lines and the dielectric layer. The passivation layer has a first dielectric constant, and the spacer has a second dielectric constant less than the first dielectric constant.

13 Claims, 18 Drawing Sheets

INTERCONNECTION STRUCTURE HAVING REDUCED CAPACITANCE AND METHOD OF MANUFACTURING THE SAME

TECHNICAL FIELD

The present disclosure relates to a wiring structure for using in a semiconductor integrated circuit and a method of manufacturing the same, and more particularly, to a semiconductor component having an interconnection structure in which wiring capacitance is effectively reduced to improve signal transmitting speed and a method of manufacturing the same.

DISCUSSION OF THE BACKGROUND

A typical integrated circuit has several vertically-stacked levels, with any given level comprising one or more layers of materials. The speed at which a signal is propagated in an integrated circuit is limited by the delay through one or more metal lines carrying the signal. This delay, commonly known as "RC delay," is determined by the product of the resistance (R) of the metal line and capacitance (C) between the metal lines and a dielectric layer provided electrical isolation between the metal lines. Reducing the capacitance of the metal lines separated by the dielectric layer lowers the RC delay and increases signal propagation speed.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor component. The semiconductor component includes a substrate, a plurality of metallic lines, a passivation layer and a spacer. The metallic lines are disposed on the substrate. The passivation layer, having a first dielectric constant, is disposed over the substrate and the metallic lines. The spacer, having a second dielectric constant, is interposed between the substrate and the passivation layer and between the metallic lines and the dielectric layer. The second dielectric constant is less than the first dielectric constant.

In some embodiments, the spacer is filled with ambient air.

In some embodiments, the semiconductor component further includes a plurality of voids buried in the passivation layer.

In some embodiments, the voids are disposed between the metallic lines.

In some embodiments, the semiconductor component further includes a plurality of first barrier liners sandwiched between the substrate and the metallic lines and surrounded by the spacer.

In some embodiments, the semiconductor component further includes a capping layer disposed over upper surfaces of the metallic lines.

In some embodiments, the semiconductor components further includes a plurality of second barrier liners interposed between the metallic layer and the capping layer and surrounded by the spacer.

In some embodiments, the metallic lines have a width that gradually decreases at positions of increasing distance from an upper surface of the substrate, and the spacer has a thickness that gradually increases at positions of increasing distance from the upper surface of the substrate.

In some embodiments, the dielectric layer and the spacer include oxide-based dielectrics.

In some embodiments, the metallic lines are electrically coupled to main features in the substrate.

Another aspect of the present disclosure provides a method of forming a semiconductor component. The method includes steps of forming a plurality of metallic lines on a substrate; depositing an insulative film to cover the substrate and the metallic lines; and depositing a passivation layer to bury the insulative film, wherein the insulative film has a topology following the topology of the substrate and the metallic lines, and the insulative film and the passivation layer have different dielectric constants.

In some embodiments, the method further includes a step of enclosing a plurality of voids in the passivation layer.

In some embodiments, the method further includes a step of performing a removal process to remove the insulative film, thus creating an air spacer interposed between the substrate and the passivation layer and between the metallic lines and the passivation layer.

In some embodiments, the method further includes a step of depositing a first barrier layer on the substrate before the forming of the metallic lines, and patterning the first barrier layer to form a plurality of first barrier liners between the substrate and the metallic lines simultaneous with the formation of the metallic lines.

In some embodiments, the formation of the metallic lines on the substrate includes steps of forming a metallic layer on the substrate; forming a capping layer having a plurality of openings on the metallic layer; and etching the metallic layer through the openings to create a plurality of trenches communicating with the openings.

In some embodiments, the method further includes a step of depositing a second barrier layer on the metallic layer prior to the formation of the capping layer, and patterning the second barrier layer simultaneous with the formation of the metallic lines.

In some embodiments, the capping layer is encased by the insulative film.

In some embodiments, the method further includes a step of removing the capping layer prior to the formation of the insulative film.

In some embodiments, the metallic lines have sloped surfaces and the trenches between adjacent pairs of the metallic lines coated with the insulative film have a substantially uniform width.

With the above-mentioned configurations of the semiconductor component, including the substrate and the interconnection structure, an effective dielectric constant of the dielectric layer combining the passivation layer with the spacer to cap the substrate and the metallic lines can be reduced, thereby reducing resistance-capacitance (RC) delay of the interconnection structure.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
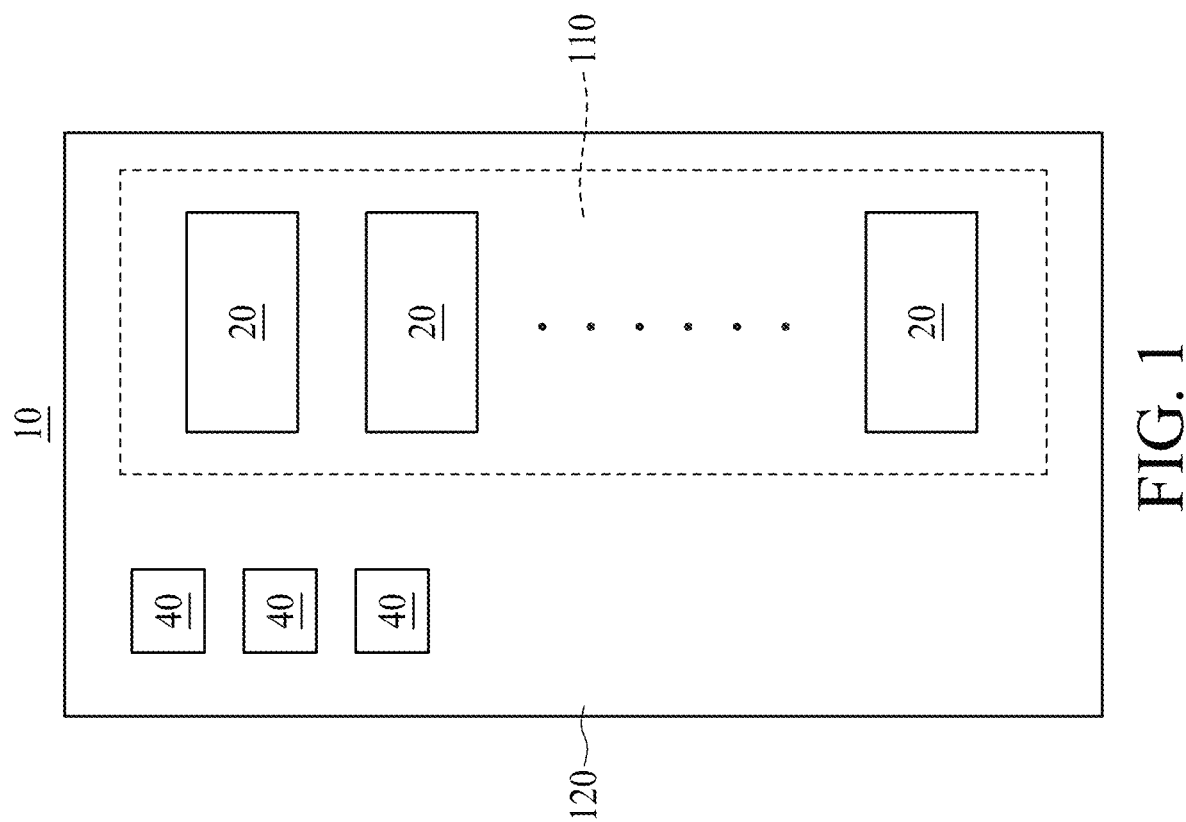
FIG. 1 is a plan view of an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a plan view of an electronic device 10 in accordance with some embodiments of the present disclosure. Referring to FIG. 1, the electronic device 10 includes one or more principal regions 110 for disposition of semiconductor components 20 and a peripheral region 120 adjacent to or around the principal regions 110 for disposition of control circuits 40, such as a logical circuit or a power supply circuit. For example, when the electronic device 10 is a dynamic random access memory (DRAM), the semiconductor components 20, in the principal region 110, can include access transistors and memory cell arrays for storing a plurality of storage data, and the peripheral region 120 can include control circuits 40 performing operation such as applying data to or obtaining data from the memory cells.

Figure 2:
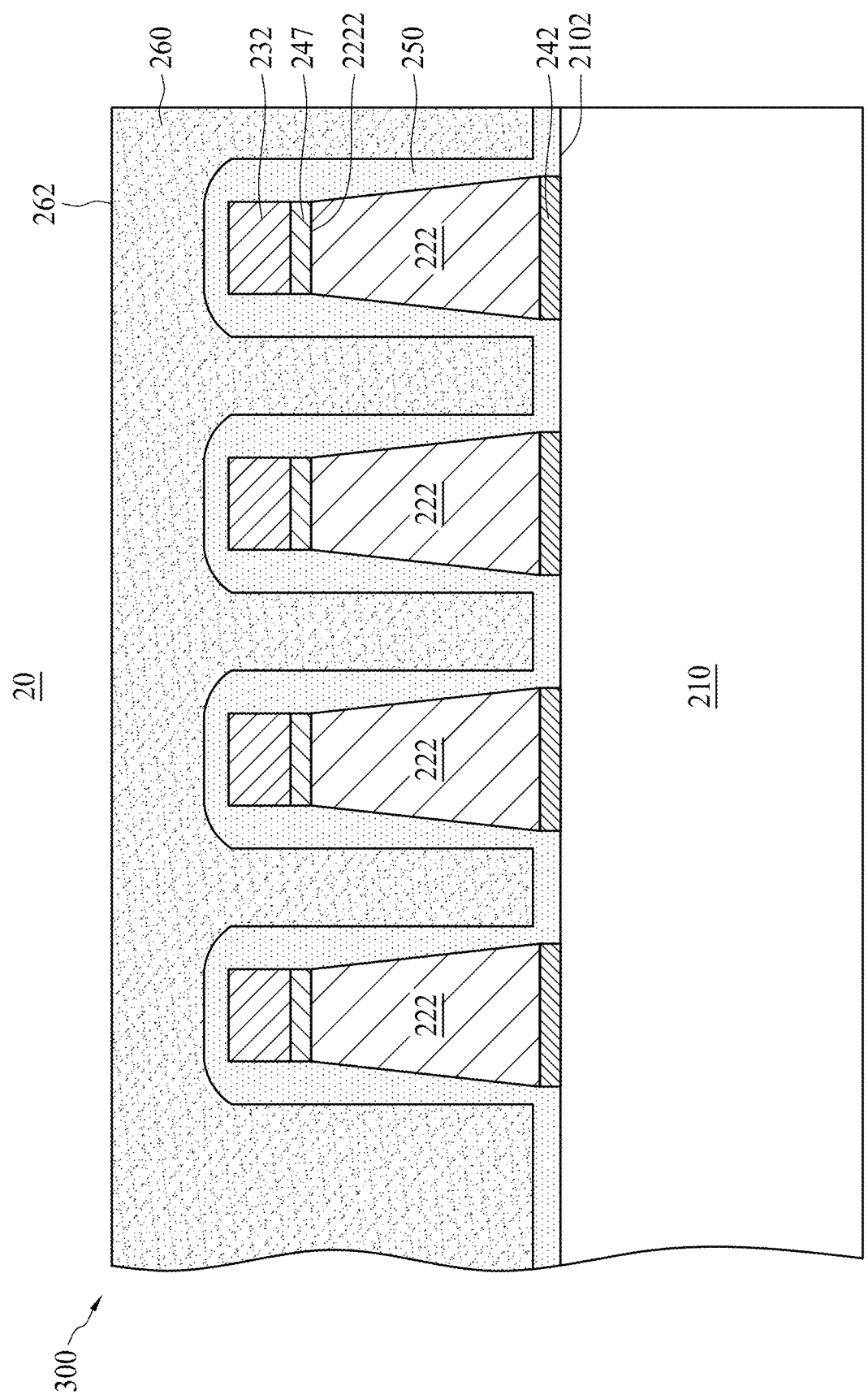
FIG. 2 is a cross-sectional view of a semiconductor component in accordance with some embodiments of the present disclosure.

FIG. 2 is cross-sectional view of the semiconductor component 20 in accordance with some embodiments of the present disclosure. Referring to FIGS. 1 and 2, the semiconductor component 20, in the principal region 110, includes a substrate 210 and an interconnection structure 300 disposed on the substrate 210. The interconnection structure 300 includes a plurality of metallic lines 222, an insulative film 250 covering the substrate 210 and the metallic lines 222, and a passivation layer 260 covering the insulative film 250.

The metallic lines 222 can be arranged in a parallel configuration. The insulative film 250, disposed on an upper surface 2102 of the substrate 210 and encasing the metallic lines 222, is a conformal layer. The passivation layer 260, having an upper surface 262 above upper surfaces 2222 of the metallic lines 222, is a void-free layer. The insulative film 250 is a spacer between the substrate 210 and the passivation layer 260 and between the metallic lines 222 and the passivation layer 260 to increase the structural strength of the interconnection structure 300. The passivation layer 260 helps protect structures of the semiconductor component 20 during packaging and in operation.

The insulative film 250 and the passivation layer 260, separating the metallic lines 222 from each other, have different dielectric constants. Specifically, the passivation layer 260 can have a first dielectric constant, and the insulative film 250 can have a second dielectric constant less than the first dielectric constant. Consequently, an effective dielectric constant of the dielectric layer combining the passivation layer 260 with the insulative film 250 to cap the substrate 210 and the metallic lines 222 can be reduced, thereby reducing resistance-capacitance (RC) delay of the interconnection structure 300. In some embodiments, the insulative film 250 and the passivation layer 260 include oxide-based dielectrics. For example, the insulative film 250 includes low-k oxide-based dielectrics, such as carbon-doped silicon oxide or fluorinated oxide, and the passivation layer 260 may include silicon oxide or silicon dioxide.

In some embodiments, the interconnection structure 300 can further include a plurality of first barrier liners 242 sandwiched between the substrate 210 and the metallic lines 222 and surrounded by the insulative film 250. The first barrier liners 242 function as a glue layer for aiding adhesion of the metallic lines 222 to the substrate 210. In addition, the first barrier liners 242 have good diffusion barrier properties to inhibit the diffusion of metal from the metallic lines 222 into the substrate 210. In some embodiments, the first barrier liners 242 can have a substantially uniform thickness and include refractory metal or refractory metal nitride.

In some embodiments, the interconnection structure 300 can also include a capping layer 232 and a second barrier layer 247 stacked on the metallic lines 222 and encased by the insulative film 250. The second battier layer 247 is disposed on the upper surface 2222 of the metallic lines 222, and the capping layer 232, serving as a hard mask for formation of the metallic lines 222, the first barrier liners 242 and the second barrier layer 247, is disposed on the second barrier layer 247. In other words, the second barrier layer 247, including refractory metal or refractory metal nitride, is interposed between the metallic lines 222 and the capping layer 232.

Figure 3A:
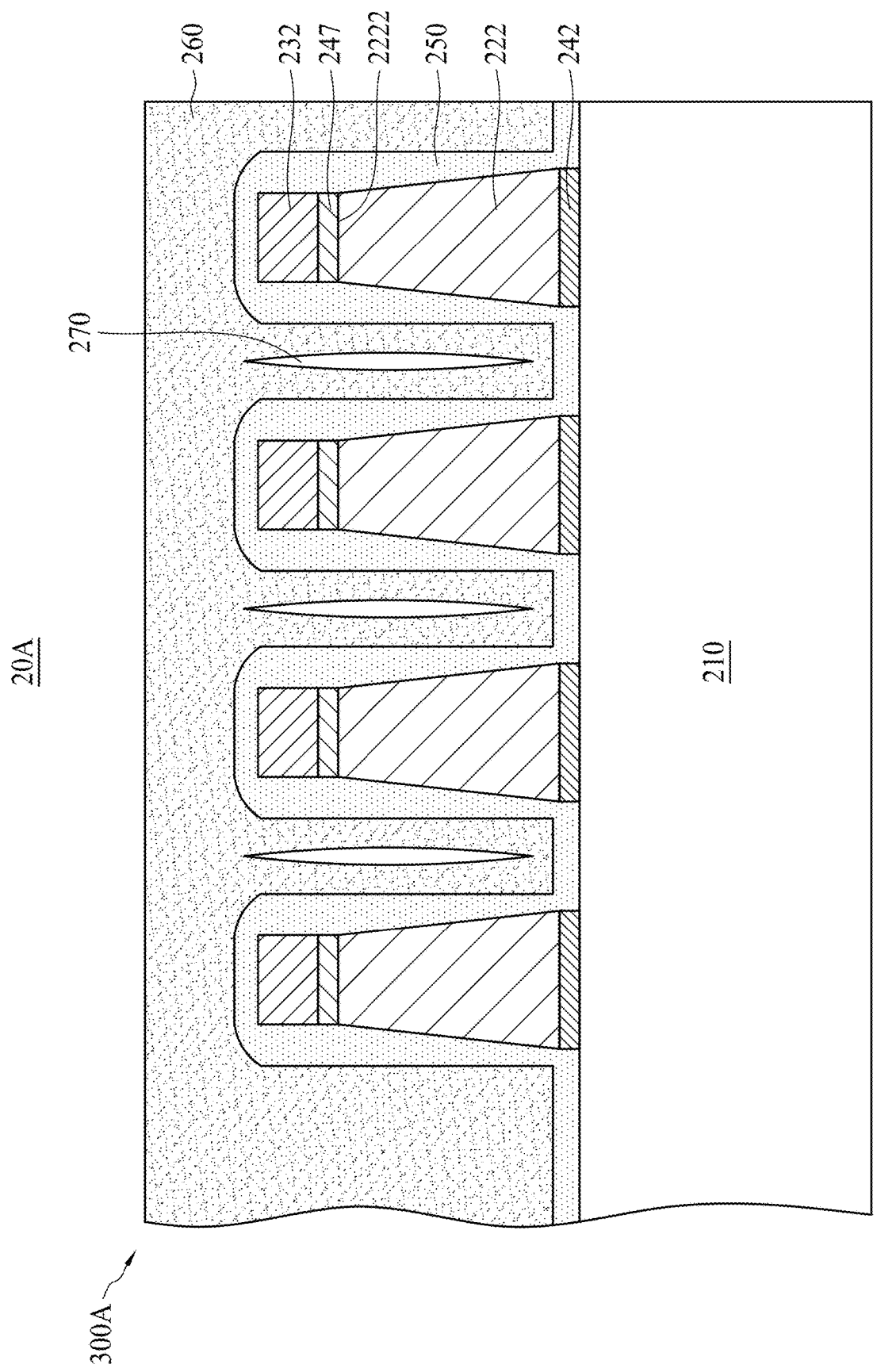
FIGS. 3A to 3C are cross-sectional views of semiconductor components in accordance with some embodiments of the present disclosure.

FIG. 3A is a cross-sectional view of a semiconductor component 20A in accordance with some embodiments of the present disclosure. Referring to FIG. 3A, the semiconductor component 20A includes a substrate 210 and an interconnection structure 300A stacked on the substrate 210. The interconnection structure 300A includes a plurality of metallic lines 222 arranged on the substrate 210 in a parallel configuration, an insulative film 250 conformally encasing the substrate 210 and the metallic lines 222, a passivation layer 260 covering the insulative film 250, and a plurality of voids 270, holding an ambient gas (such as air), buried in the passivation layer 260.

The passivation layer 260 includes oxide-based dielectrics having a first dielectric constant, and the insulative film 250 has a second dielectric constant less than the first dielectric constant. The voids 270 hold air, which has a dielectric constant or k value of about 1, and can reduce an effective dielectric constant of the passivation layer 260. Therefore, the RC delay of the interconnection structure 300A can be reduced, and the speed of the signal transmission through the interconnection structure 300A is thus increased.

The interconnection structure 300A can optionally include a plurality of first barrier liners 242 interposed between the substrate 210 and the metallic lines 222, a capping layer 232 covering upper surfaces 2222 of the metallic lines 222, and a second barrier layer 247 sandwiched between the metallic lines 222 and the capping layer 232. The insulative film 250 encases the first and second barrier liners 242 and 247 and the capping layer 232, by which the structural strength of the interconnection structure 300A can be increased.

Figure 3B:
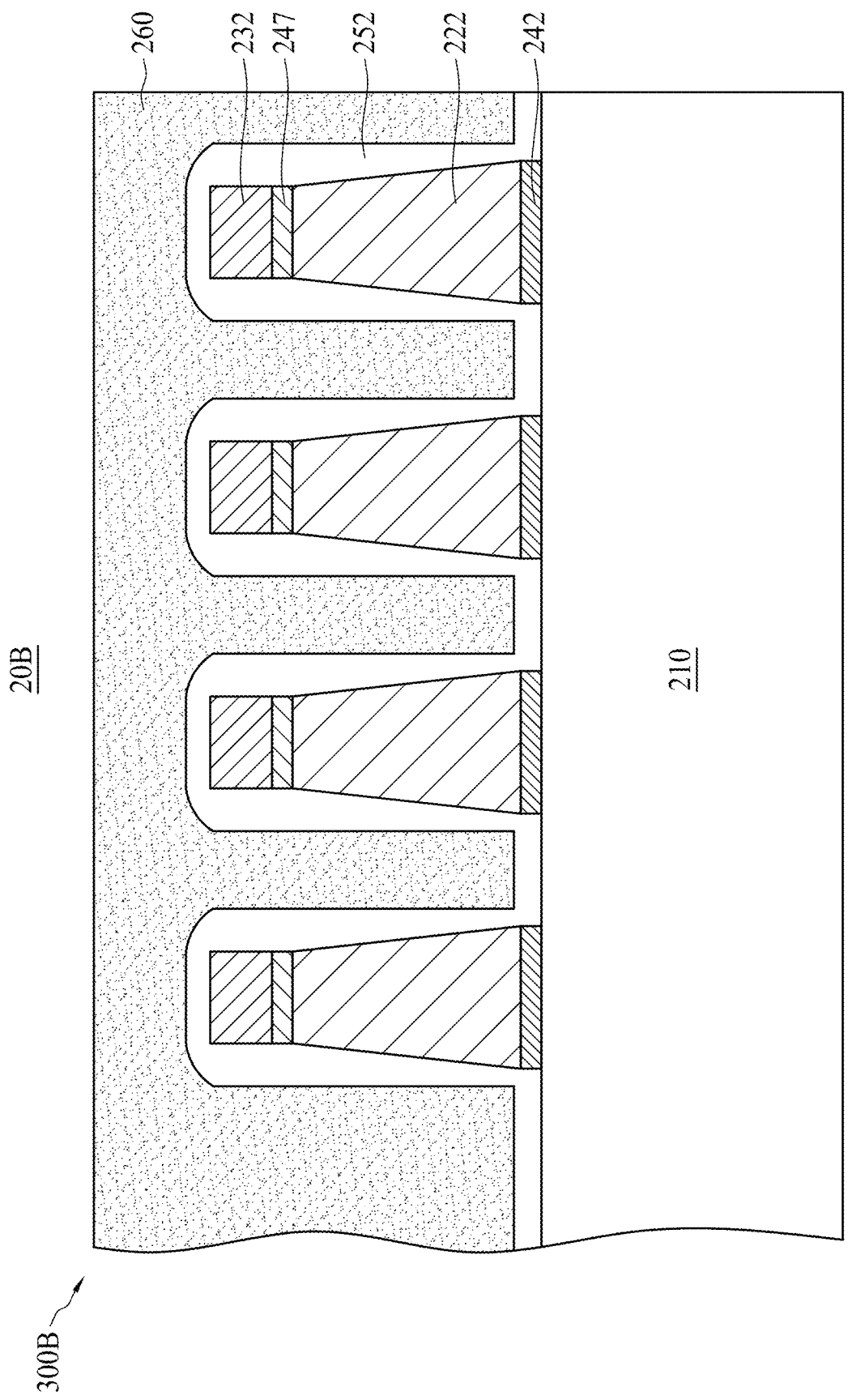

FIG. 3B is a cross-sectional view of a semiconductor component 20B in accordance with some embodiments of the present disclosure. Referring to FIG. 3B, the semiconductor component 20B includes a substrate 210 and an interconnection structure 300B stacked on the substrate 210. The interconnection structure 300B includes a plurality of metallic lines 222 disposed on the substrate 210 in a parallel configuration, and a passivation layer 260 disposed over the metallic lines 222, wherein an air spacer 252, which has a dielectric constant or k value of about 1, is interposed between the substrate 210 and the passivation layer 260 and between the metallic lines 222 and the passivation layer 260. Hence, an effective dielectric constant of the dielectric layer combining the passivation layer 260 with the air spacer 252 to cap the substrate 210 and the metallic lines 222 can be reduced, thereby reducing RC delay of the interconnection structure 300B.

In some embodiments, a plurality of first barrier liners 242, provided between the substrate 210 and the metallic lines 222, are employed to prevent the metallic lines 242 from flaking or spalling from the substrate 210, and a capping layer 232, which functions as a hard mask for formation of the metallic lines 222 and the first barrier liners 242, can be left on the metallic lines 222 to reduce the manufacturing steps and hence cost. In some embodiments, the interconnection structure 300B can optionally include a plurality of second barrier liners 247 disposed between the metallic lines 242 and the capping layer 232.

Figure 3C:
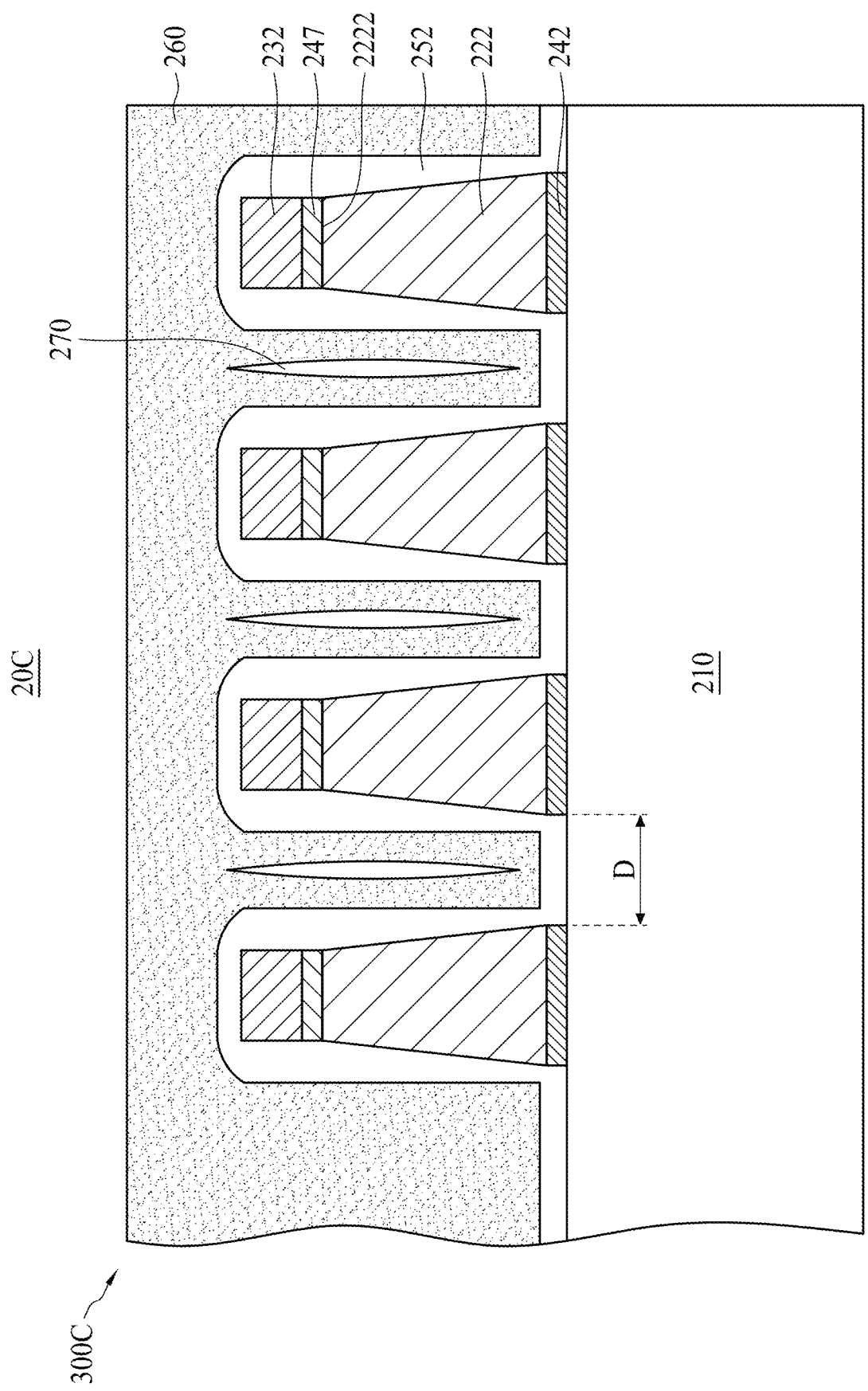

FIG. 3C is a cross-sectional view of a semiconductor component 20C in accordance with some embodiments of the present disclosure. Referring to FIG. 3C, the semiconductor component 20C includes a substrate 210 and an interconnection structure 300C stacked on the substrate 210. The interconnection structure 300C includes a plurality of metallic lines 222 arranged on the substrate 210 such that adjacent pairs of the metallic lines 222 are separated by a predetermined distance D, a passivation layer 260 disposed over the metallic lines 222, and a plurality of voids 270, holding an ambient gas (such as air), introduced in the passivation layer 260 to reduce an effective dielectric constant of the passivation layer 260 containing oxide.

The interconnection structure 300C further includes an air spacer 252, which has a dielectric constant of about 1, interposed between the substrate 210 and the passivation layer 260 and between the metallic lines 222 and the passivation layer 260, thereby reducing an effective dielectric constant of the dielectric combination of the air spacer 252, the passivation layer 260 and the voids 270 capping the substrate 210 and the metallic lines 222. In some embodiments, a plurality of first barrier liners 242 can be optionally placed between the substrate 210 and the metallic lines 222, a capping layer 232 can be optionally disposed over the metallic lines 222, and a plurality of second barrier liners 247 may be optionally provided to separate the capping layer 232 from the metallic lines 222. In other words, the second barrier liners 247, covering upper surfaces 2222 of the metallic lines 222, is interposed between the metallic lines 222 and the capping layer 232.

Figure 4:
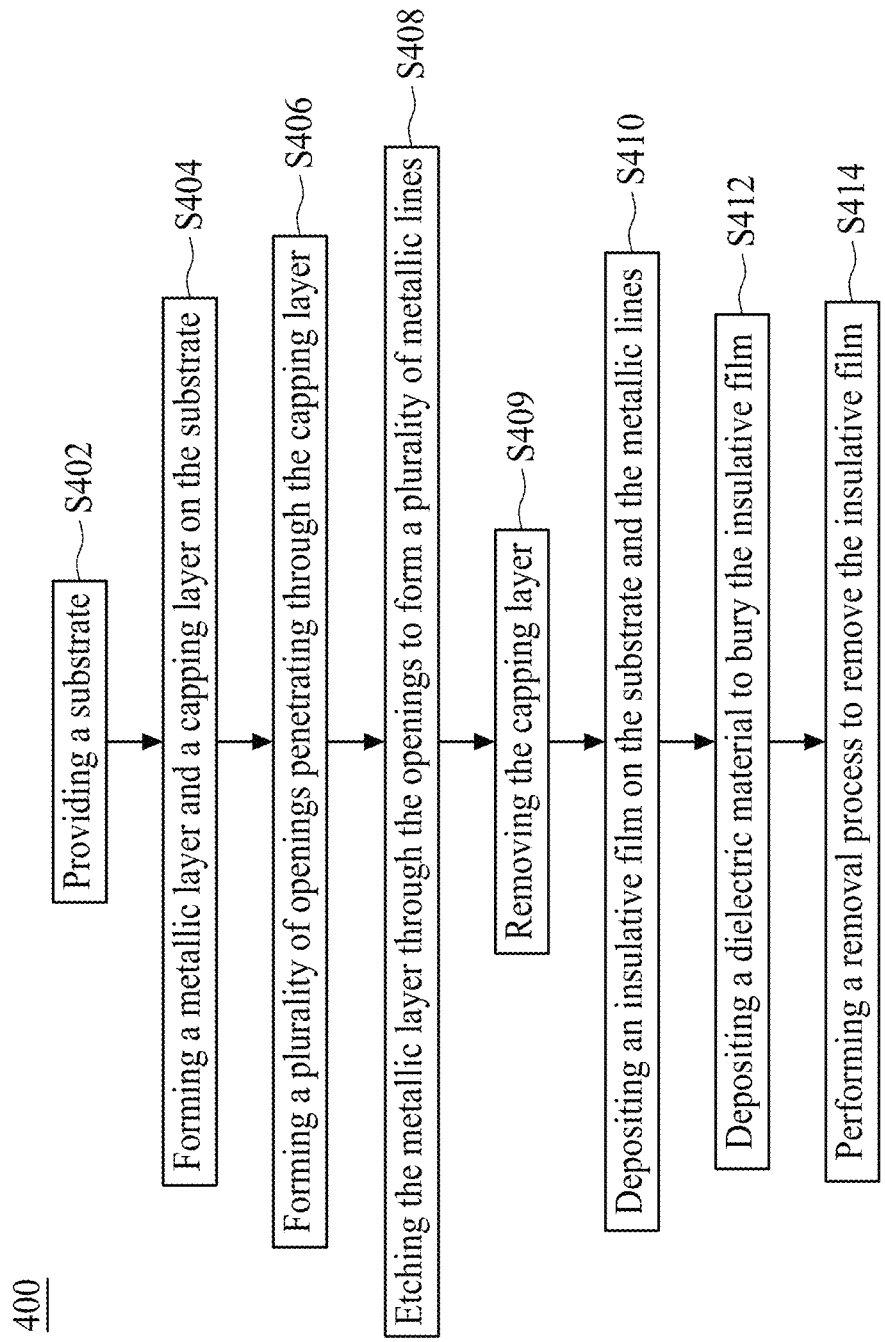
FIG. 4 is a flow diagram illustrating a method of manufacturing a semiconductor device in accordance with some embodiments of the present disclosure.

FIG. 4 is a flow diagram illustrating a method 400 of manufacturing semiconductor components in accordance with some embodiments of the present disclosure, and FIGS. 5 through 16 illustrate cross-sectional views of intermediate stages in the formation of semiconductor components in accordance with some embodiments of the present disclosure. The stages shown in FIGS. 5 to 16 are also illustrated schematically in the flow diagram in FIG. 4. In the following discussion, the fabrication stages shown in FIGS. 5 to 16 are discussed in reference to the process steps shown in FIG. 4.

Figure 5:
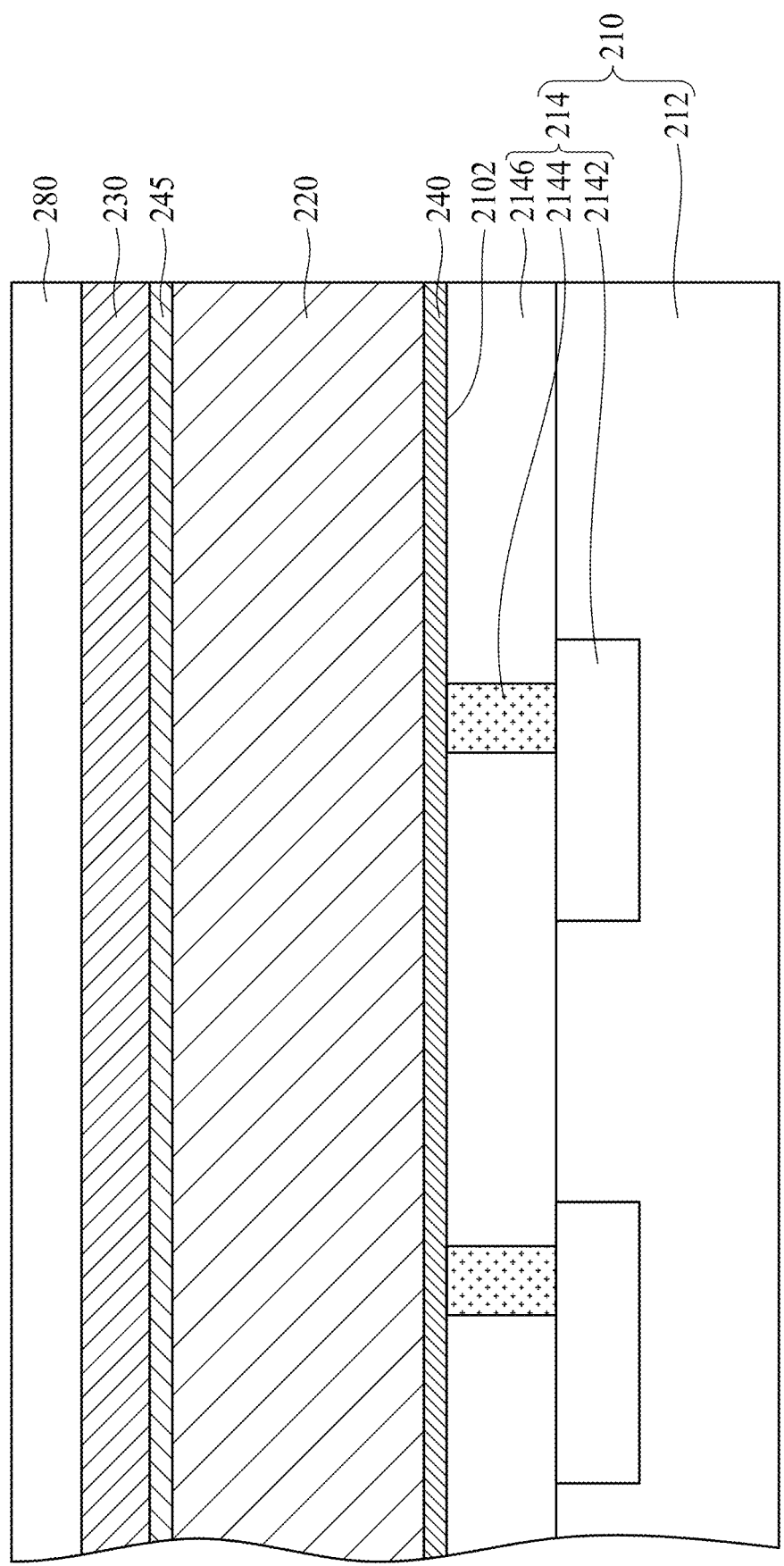
FIGS. 5 through 16 illustrate cross-sectional views of intermediate stages in the formation of semiconductor components in accordance with some embodiments of the present disclosure.

Referring to FIG. 5, a substrate 210 is provided according to a step S402 in FIG. 4. The substrate 210 can includes a semiconductor wafer 212 and one or more main features 214 formed on or in the semiconductor wafer 212. The semiconductor wafer 212 can be made of silicon. Alternatively or additionally, the semiconductor wafer 212 may include other elementary semiconductor materials such as germanium. In some embodiments, the semiconductor wafer 212 is made of a compound semiconductor such as silicon carbide, gallium arsenic, indium arsenide, or indium phosphide. In some embodiments, the semiconductor wafer 212 is made of an alloy semiconductor such as silicon germanium, silicon germanium carbide, gallium arsenic phosphide, or gallium indium phosphide. In some embodiments, the semiconductor wafer 212 can include an epitaxial layer. For example, the semiconductor wafer 212 has an epitaxial layer overlying a bulk semiconductor. The semiconductor wafer 212 may include various doped regions (not shown) doped with p-type dopants, such as boron, and/or n-type dopants, such as phosphorus or arsenic.

In some embodiments, isolation features (not shown), such as shallow trench isolation (STI) features or local oxidation of silicon (LOCOS) features, can be introduced in the semiconductor wafer 212 to define and isolate various main features 214 in the semiconductor wafer 212. The main features 214 can include transistors 2142, conductive plugs 2144 electrically coupled to the transistors 2142, and an interlayer dielectric 2146 covering the semiconductor wafer 212 and encasing the transistors 2142 and the conductive plugs 2144. In some embodiments, the main features 214 can further include capacitors (not shown) disposed in or on the semiconductor wafer 212 and electrically coupled to the transistors 2142, wherein the capacitors are buried in the interlayer dielectric 2146. Various processes are performed to form the main features 214, such as deposition, etching, implantation, photolithography, implementation, annealing, and/or other applicable processes.

Next, a metallic layer 220 and a capping layer 230 are sequentially formed on the substrate 210 according to a step S404 in FIG. 4. The metallic layer 220 is formed on the entire upper surface 2102 of the substrate 210. In some embodiments, the metallic layer 220 includes aluminum or aluminum alloys. In alternative embodiments, the metallic layer 220 can include copper or copper alloys, which have lower resistance than aluminum. The semiconductor components that employ the copper or copper alloys as the metallic layer can reduce the RC delay. The metallic layer 220 may be formed using a physical vapor deposition (PVD) process, a chemical vapor deposition (CVD) process, or a sputtering process.

In some embodiments, before the deposition of the metallic layer 220, a first barrier layer 240 can be optionally deposited on the substrate 210 to prevent the metallic layer 220 from spalling from the substrate 210. Prior to the formation of the capping layer 230, a second barrier layer 245 can be optionally formed on the metallic layer 220 for preventing diffusion of the metal contained in the metallic layer 220. The first and the second barrier layer 240 and 245, formed using a PVD process, a CVD process, or a sputtering process, may be a single-layered structure or a multi-layered structure including refractory metals (such as titanium or tantalum), refractory metal nitrides, or refractory metal silicon nitrides.

The capping layer 230 disposed on the second barrier layer 245 functions as a hard mask for patterning the metallic layer 220 (and the first and second barrier layer 240 and 245). The capping layer 230 can be made of silicon-containing material, such as silicon oxycarbide or silicon oxynitride, using a CVD process. Next, a photoresist layer 280 is applied over the capping layer 230 by a spin-coating process and then dried using a soft-baking process.

Figure 6:
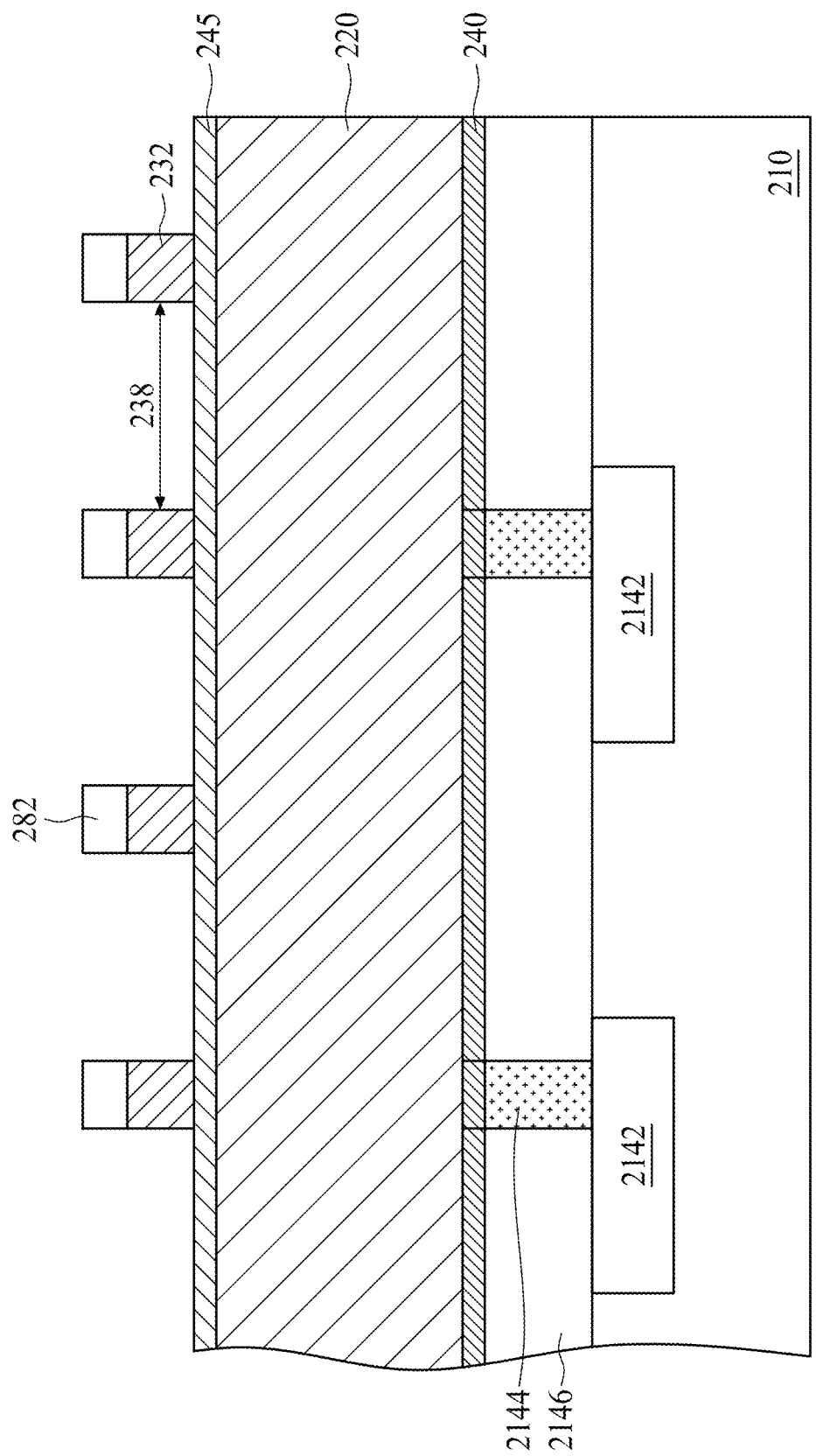

Referring to FIGS. 5 and 6, the photoresist layer 280 is exposed and developed to form a photoresist mask 282 for an etching process of the capping layer 230. Next, portions of the capping layer 230 not protected by the photoresist mask 282 are removed to form multiple openings 238 penetrating through the capping layer 230 according to a step S406. The photoresist mask 282 is removed after the performing of the etching process using an ashing process or a strip process, for example.

Figure 7:
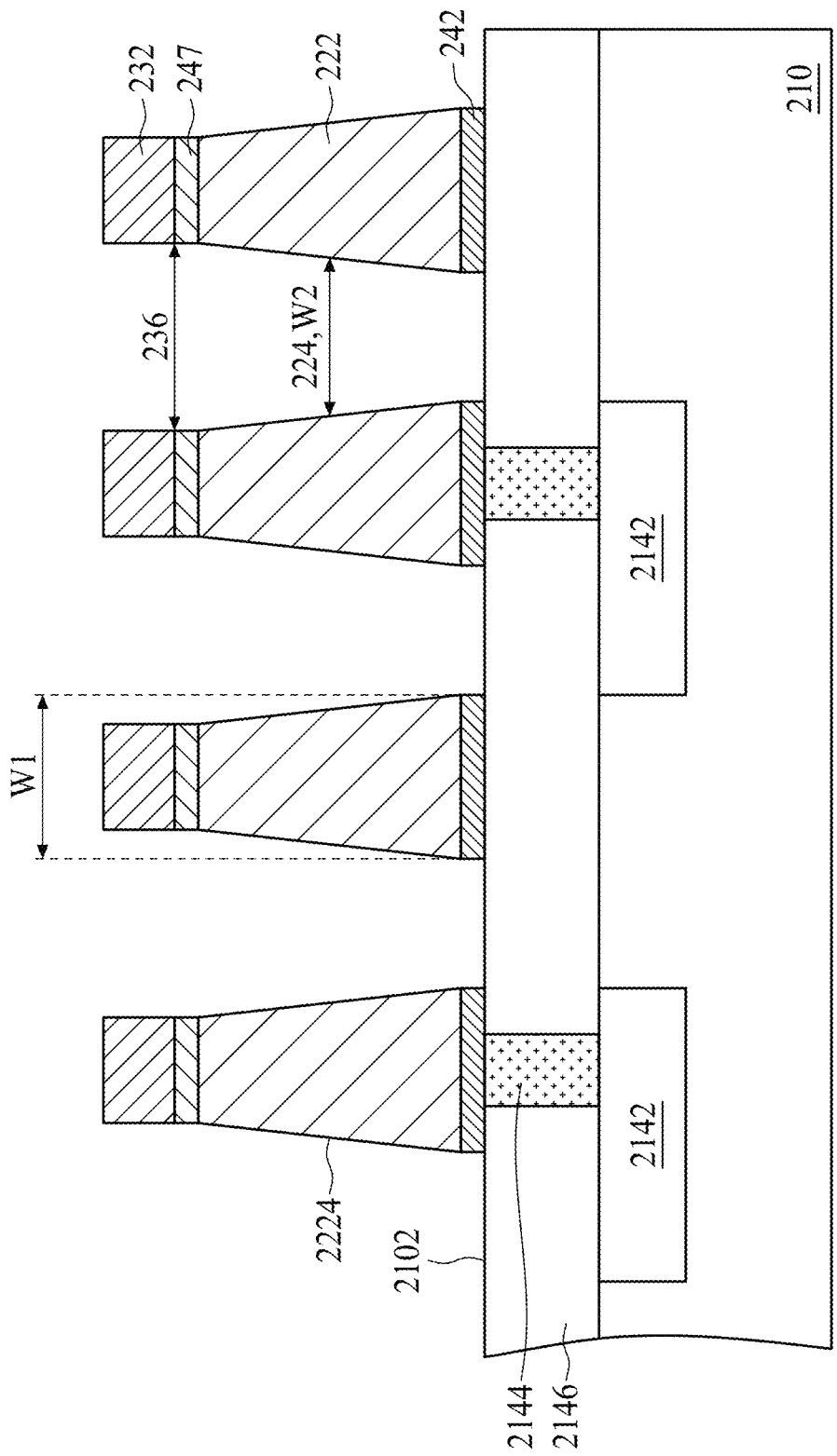

Referring to FIGS. 6 and 7, the second barrier layer 245, the metallic layer 220 and the first barrier layer 240 are sequentially etched through the openings 238 to expose portions of the substrate 210 according to a step S408 in FIG. 4. Consequently, a plurality of metallic lines 222, a plurality of first barrier liners 242, and a plurality of second barrier liners 247 are formed, and a plurality of trenches 224 penetrating through the metallic layer 220, the first barrier layer 240 and the second barrier layer 245 are created to expose the portions of the substrate 210.

As shown in FIG. 7, each of the metallic lines 222 has a tapering width W1, which gradually decreases at positions of increasing distance from the substrate 210. In other words, sidewalls 2224 of the metallic lines 222 are sloped surfaces and the trenches 224 can have a width W2 that gradually increases at positions of increasing distance from the substrate 210. In some embodiments, the metallic lines 222, the first barrier liners 242, and the second barrier liners 247 are electrically coupled to the conductive plugs 2144 disposed directly beneath the metallic lines 222. In some embodiments, the metallic layer 220, the first barrier layer 240 and the second barrier layer 245 are anisotropically dry-etched, using a reactive ion etching (RIE) process, for example.

Figure 8:
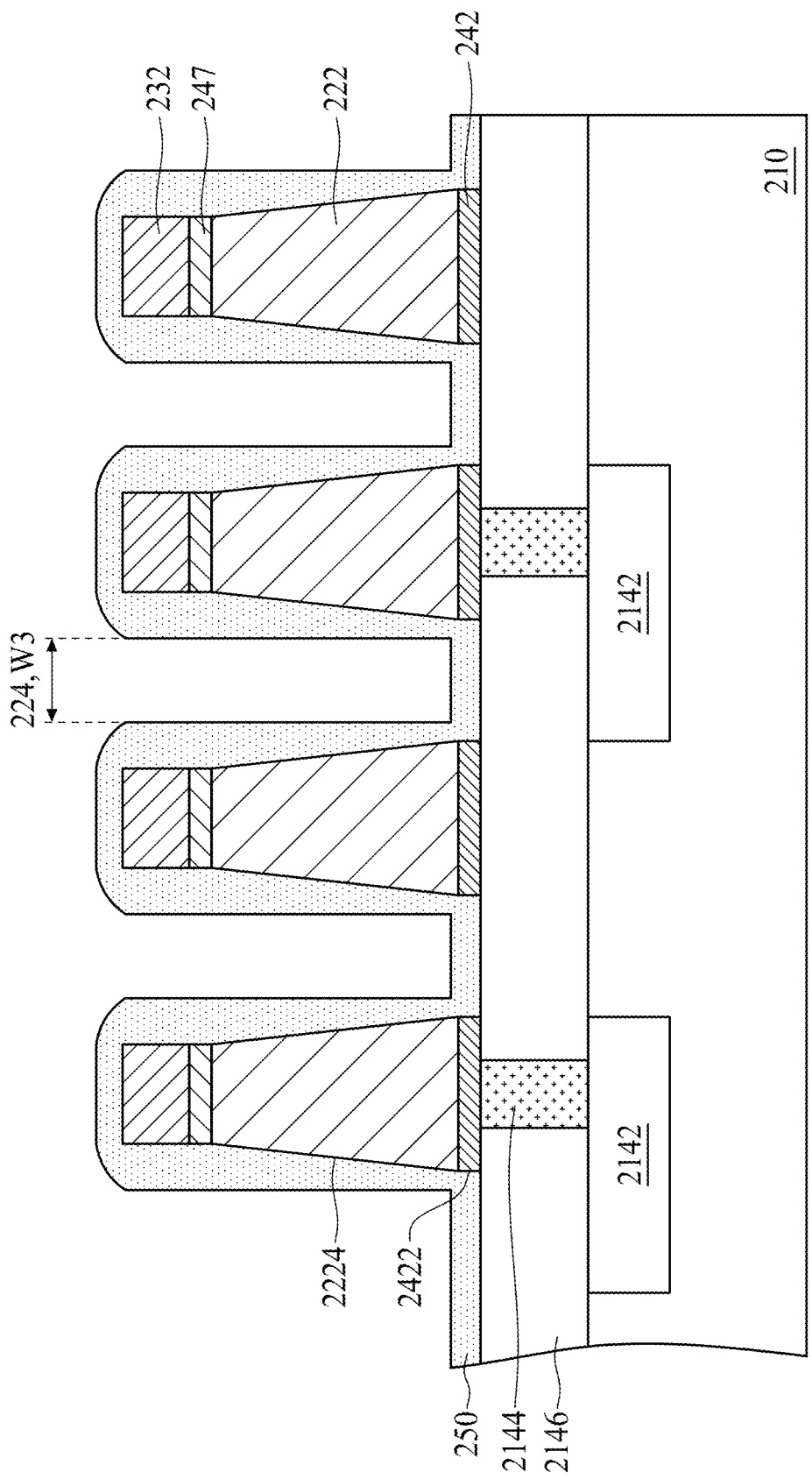

Referring to FIG. 8, an insulative film 250 is coated on the substrate 210, the metallic lines 222, the capping layer 232, the first barrier liners 242 and the second barrier liners 247 according to a step S410 in FIG. 4. The insulative film 250, formed by depositing an insulative material to cover the substrate 210, the first barrier liners 242, the metallic lines 222, the second barrier liners 247 and the capping layer 232, is a conformal layer. In other words, the trenches 224 are not entirely filled with the insulative material.

Due to the directionality in the deposition of the insulative material toward the substrate 210, and because the width W1 of the metallic lines 222 gradually increases at positions of increasing distance from the capping layer 232, the rate of the deposition of the insulative material at sidewalls 2224 of the metallic lines 222 proximal to the capping layer 232 is greater than the rate of the deposition of the insulative material at the sidewalls 2224 proximal to the substrate 210. In other words, the thickness of the insulative film 250 on the sidewalls 2224 of the metallic lines 222 gradually increases at positions of increasing distance from the substrate 210. Thus, the trenches 224 between adjacent pairs of the metallic lines 222 coated with the insulative film 250 can have a substantially uniform width W3. In some embodiments, the insulative material deposited on the substrate 210 and the capping layer 230 can have a uniform thickness if the metallic lines 222 have the same width. In some embodiments, the insulative film 250 can include low-k oxide-based dielectrics. In alternative embodiments, the insulative film 250 can be an energy-stripping film. The insulative film 250 can be formed using a CVD process.

Figure 9:
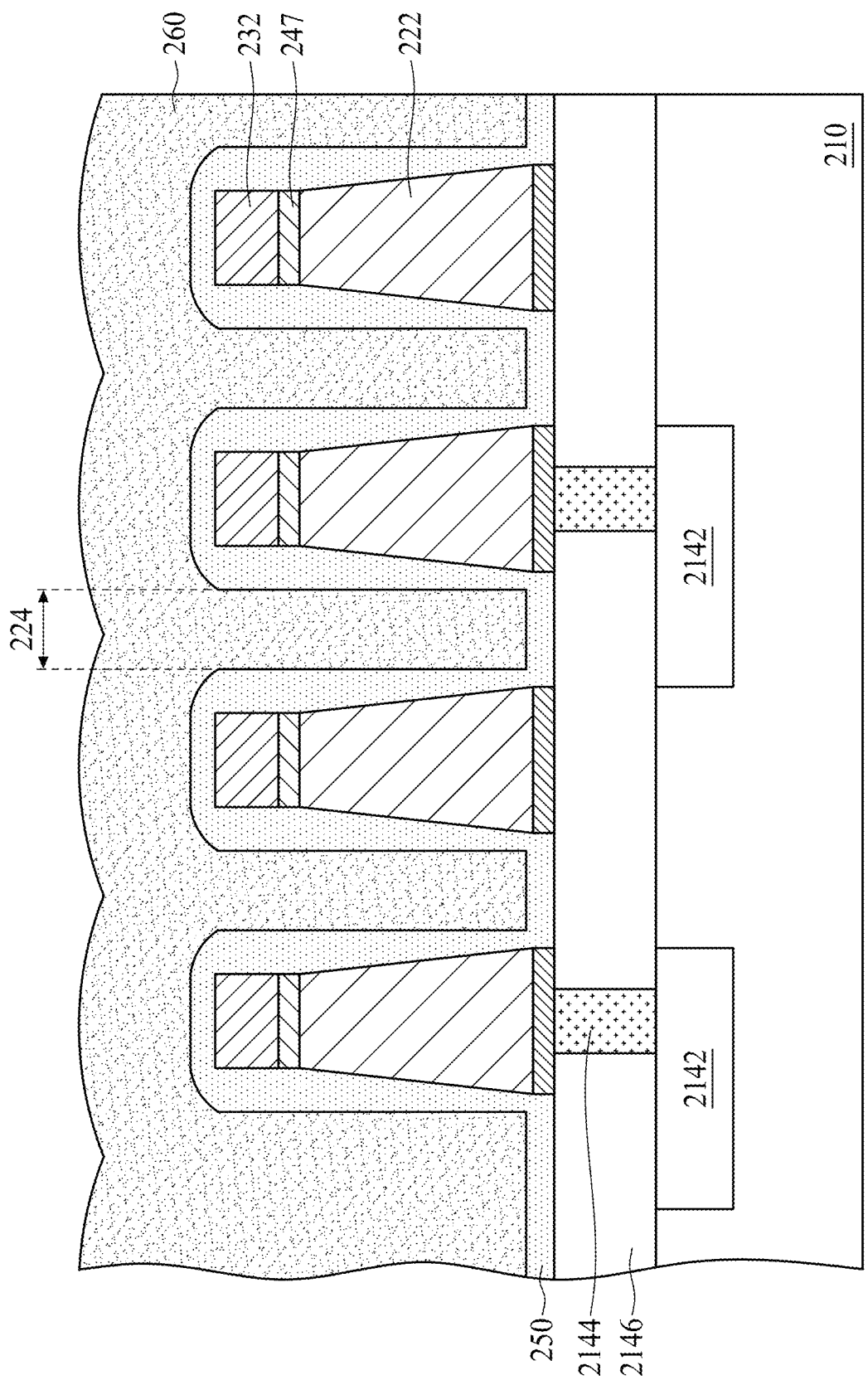
Figure 10:
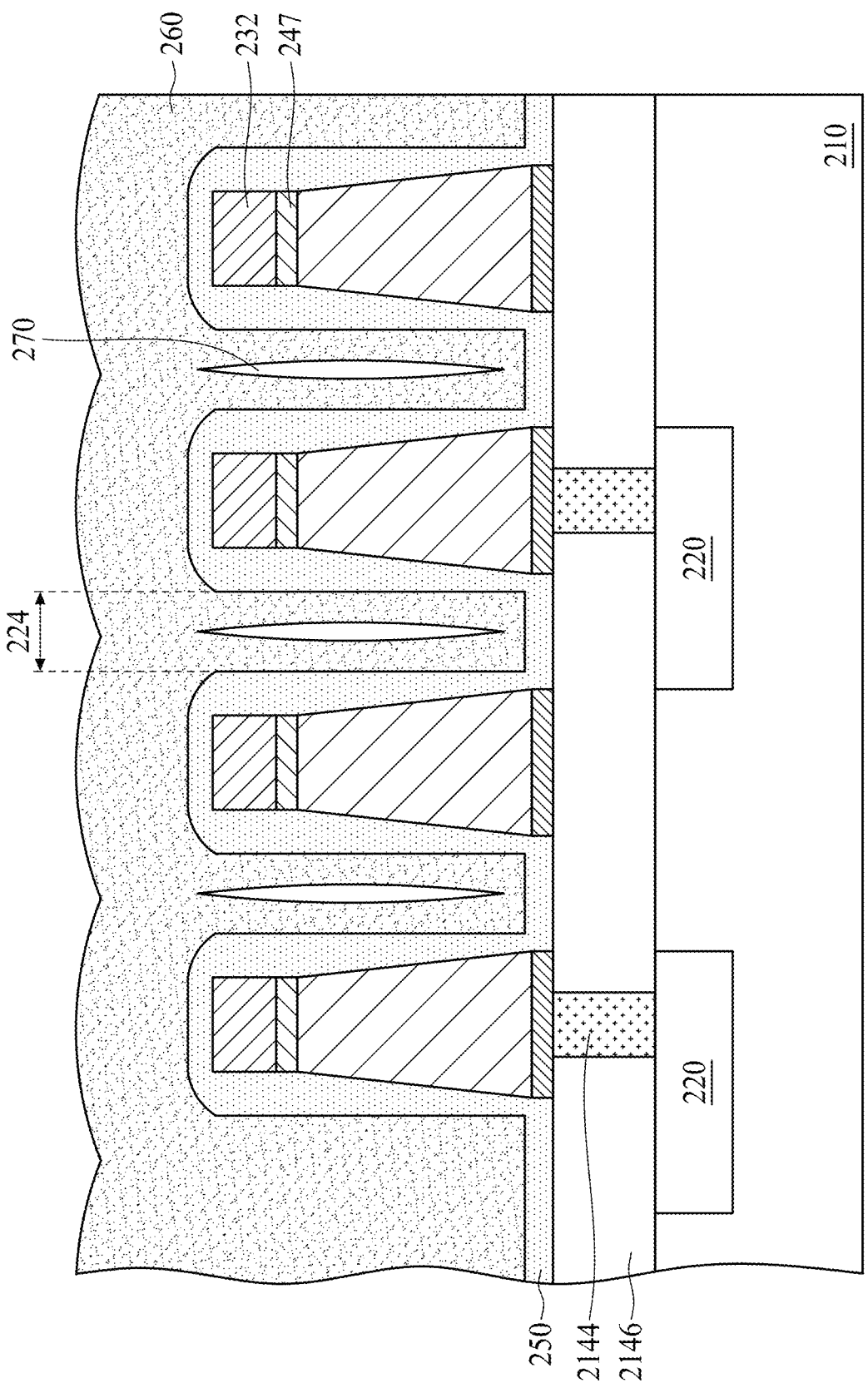
Figure 11:
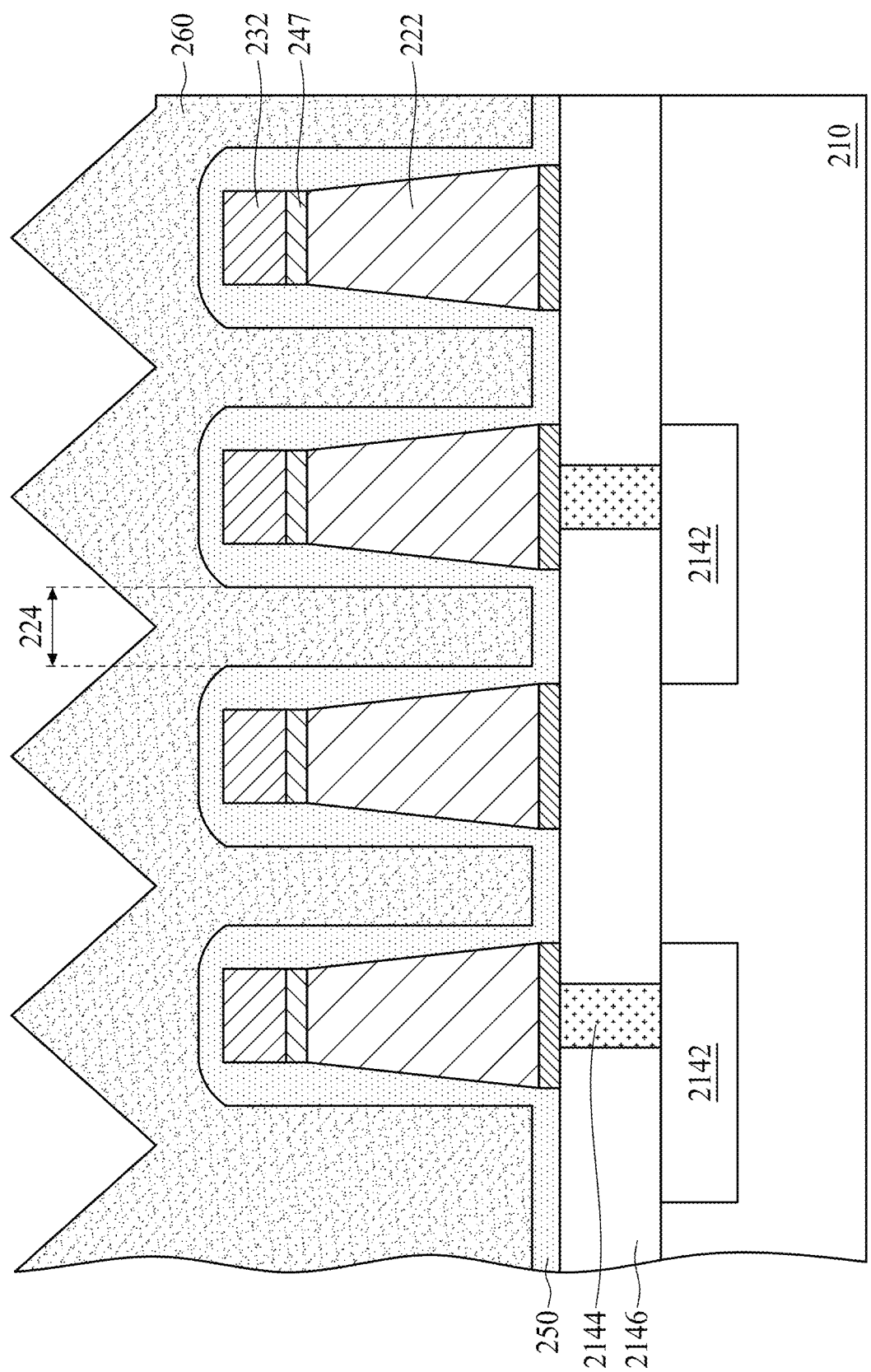
Figure 12:
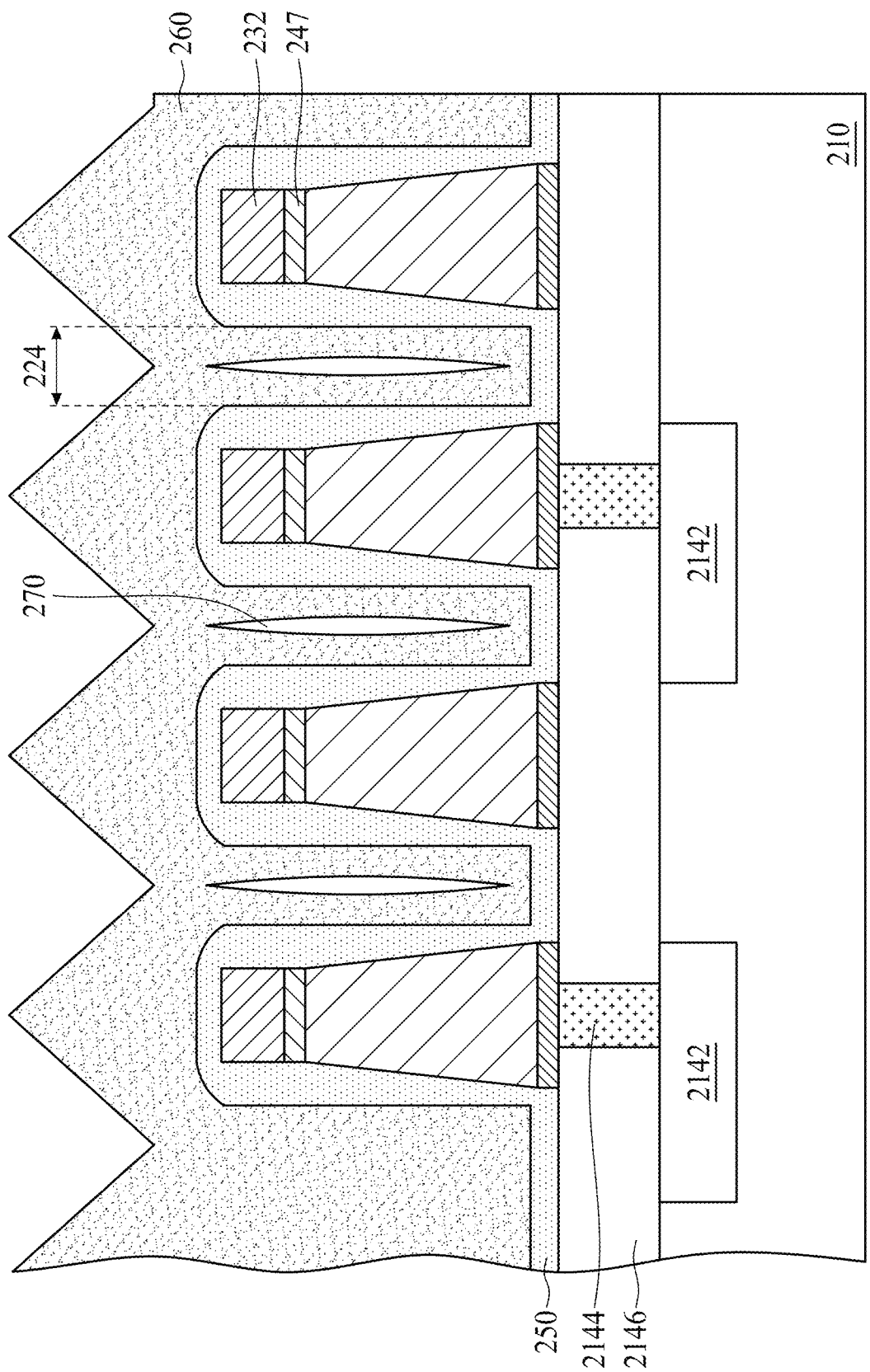

Referring to FIGS. 9 to 12, a passivation layer 260 is formed to bury the insulative film 250 according to a step S412 in FIG. 4. The passivation layer 260, filling the trenches 224, is formed by conformally and uniformly depositing a dielectric material on the insulative film 250, wherein the insulative film 250 shown in FIGS. 9 and 10 includes the low-k oxide-based dielectrics, while the insulative film 250 shown in FIGS. 11 and 12 is the energy-stripping film. The trenches 224 can be entirely filled with the dielectric material, as shown in FIGS. 9 and 11, by performing a high-density plasma CVD process. In other words, the passivation layer 260 shown in FIGS. 9 and 11 is a void-free layer. Alternatively, a plurality of voids 270, holding an ambient gas (such as air), can be enclosed in the dielectric material, as shown in FIGS. 10 and 12, by performing a CVD process.

In some embodiments, a planarizing process can be optionally performed on the passivation layer 260 shown in FIGS. 8 and 9 to yield an acceptably flat topology. Thus, the semiconductor components 20 and 20A shown in FIGS. 2 and 3A are completely formed. The dielectric material of the passivation layer 260 has a first dielectric constant, and the insulative film 250, including the low-k oxide-based dielectric, has a second dielectric constant less than the first dielectric constant. Due to the use of the insulative film 250 including the low-k oxide-based dielectric, an effective dielectric constant of the dielectric material over the substrate 210 and the metallic lines 222 is reduced. Hence, an effective capacitance of a capacitor formed by two adjacent metallic lines 222 separated by the insulative film 250 and the passivation layer 260 can be reduced.

Figure 13:
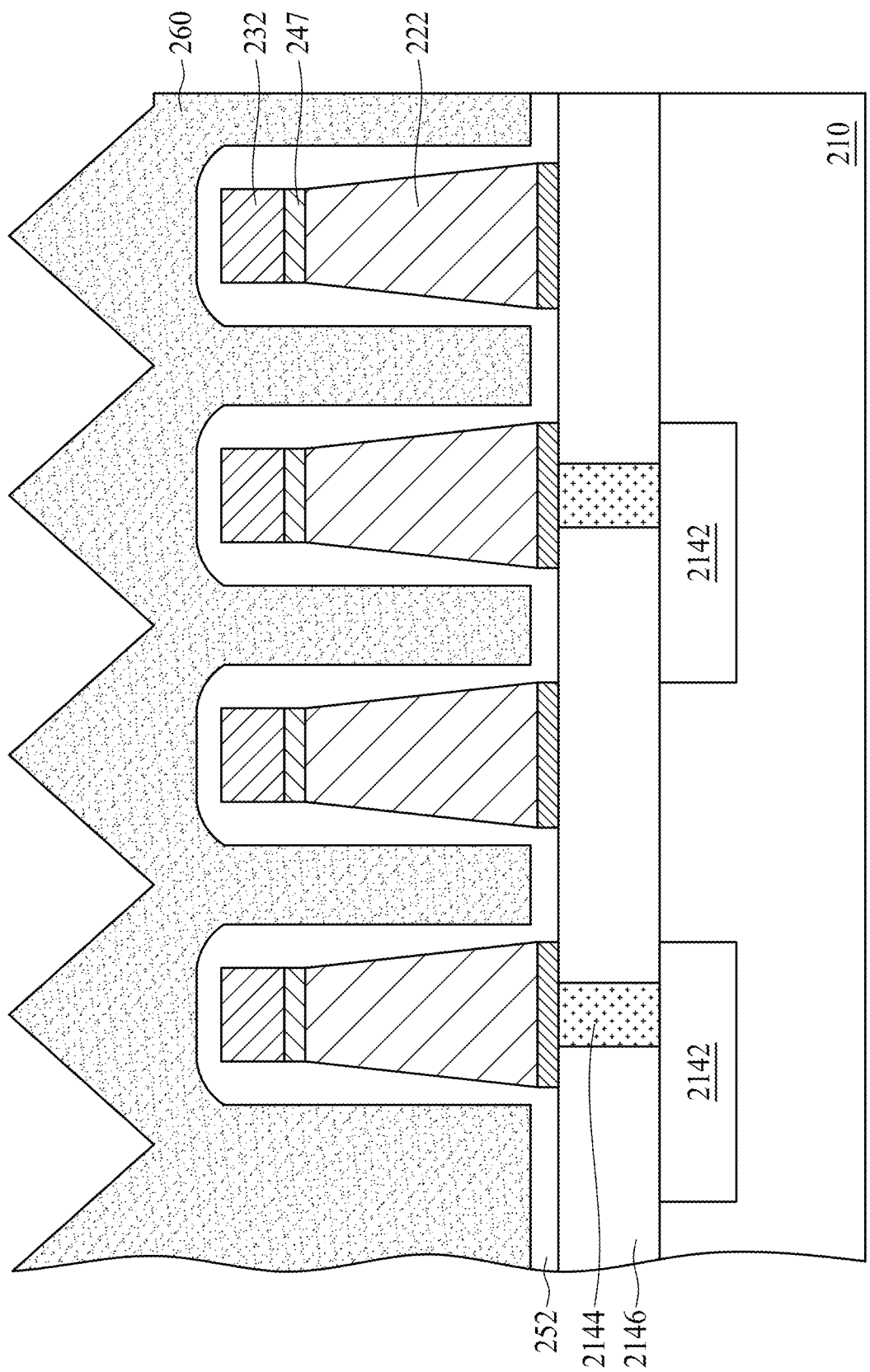
Figure 14:
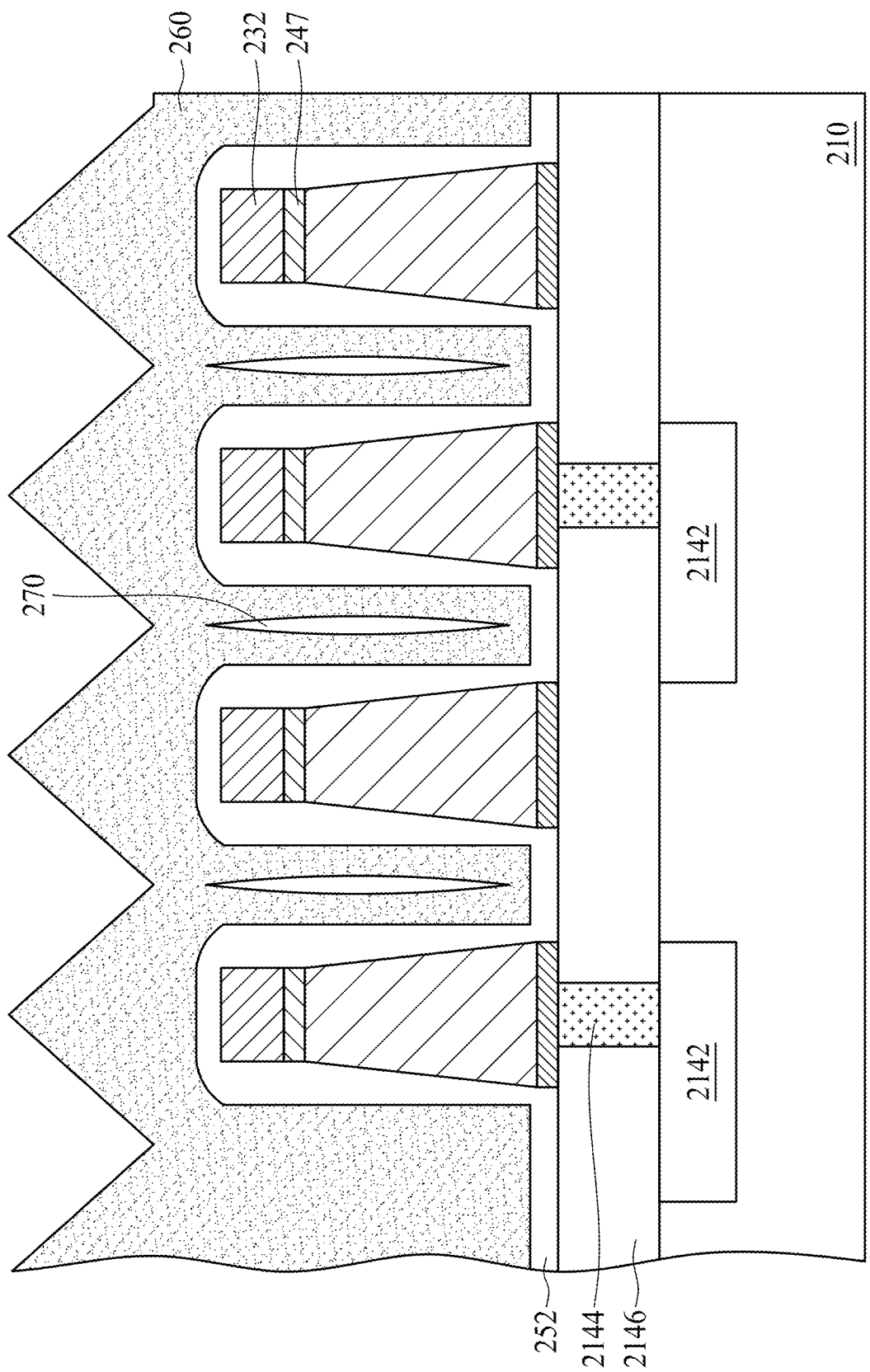

Referring to FIGS. 13 and 14, after the deposition of the passivation layer 260, a removal process is performed on the structure shown in FIGS. 11 and 12 to remove the insulative film 250 according to a step S414 in FIG. 4. Hence, an air spacer 252, holding ambient air, is created. In some embodiments, the insulative film 250 can be removed using a thermal treatment. In some embodiments, a planarizing process can be performed on the passivation layer 260 shown in FIGS. 13 and 14 to yield an acceptably flat topology. Thus, the semiconductor components 20B and 20C shown in FIGS. 3B and 3C are completely formed.

Figure 15:
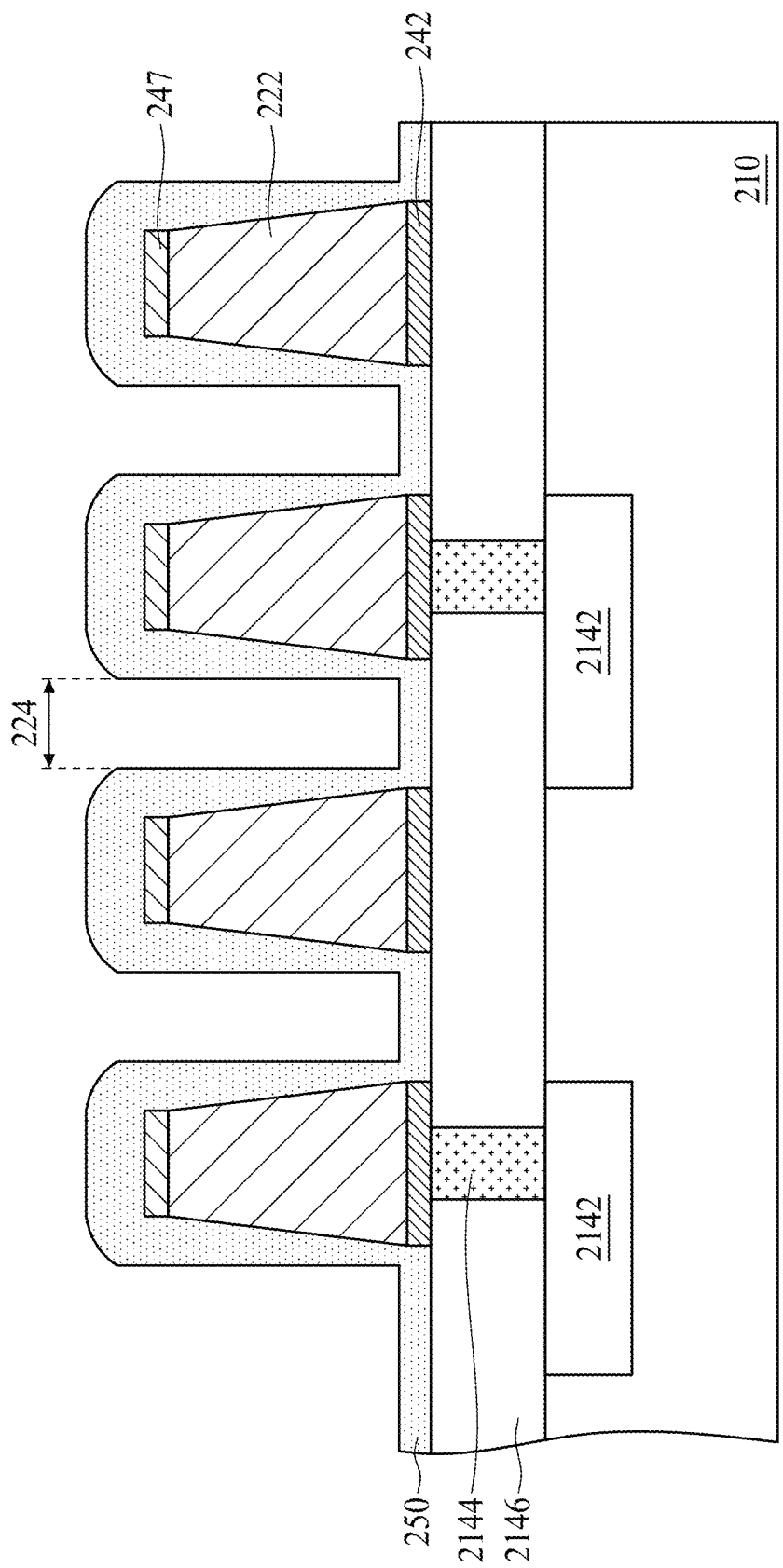
Figure 16:
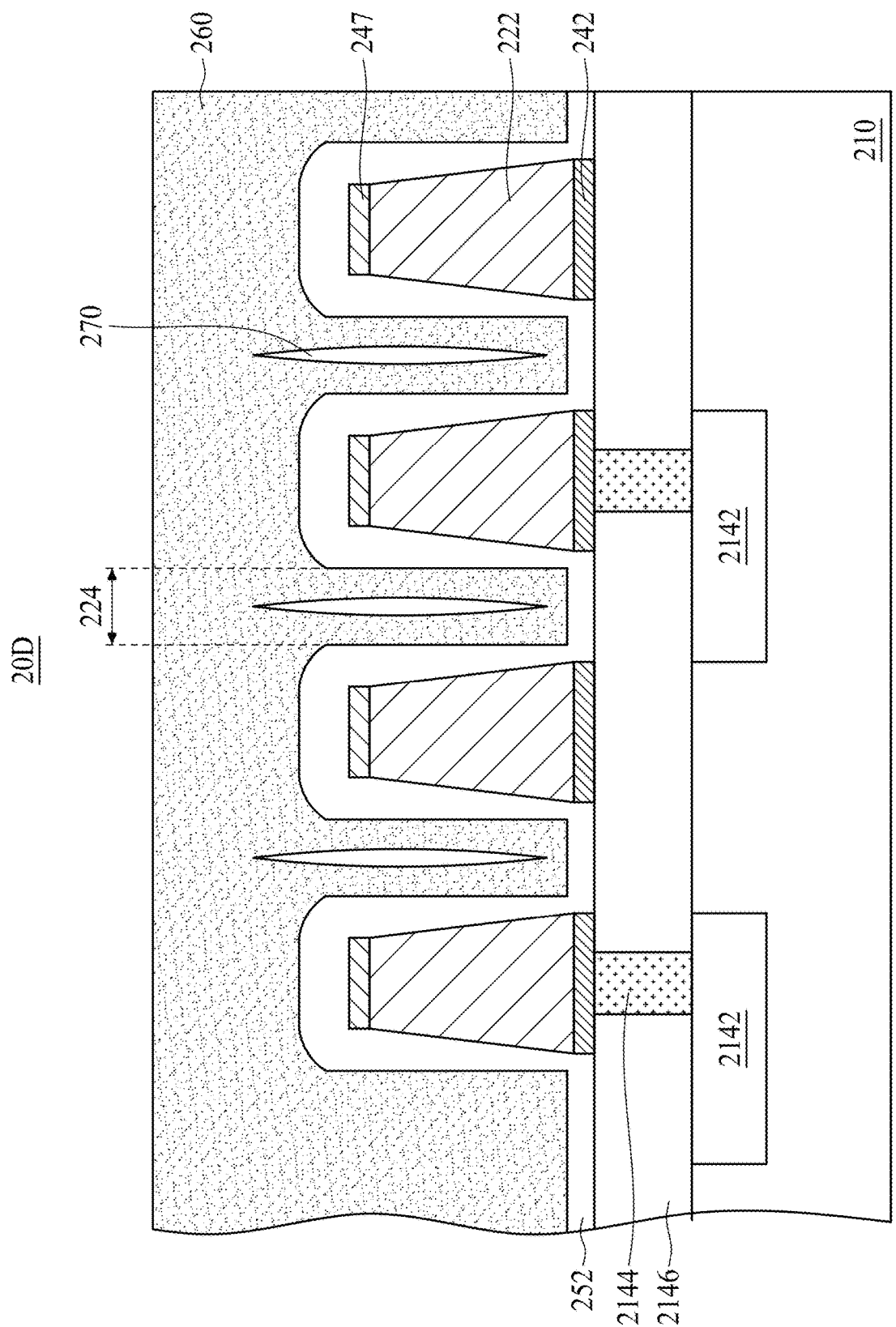

It should be noted that after the etching of the metallic layer 220 and the first and second barrier layer 240 and 245, the capping layer 232 remaining on the metallic lines 222 can be removed according to a step S409 in FIG. 4. The capping layer 232 can be removed using wet etching processes. Referring to FIG. 15, after the removal of the capping layer 232, an insulative film 250 is coated on the substrate 210, the metallic lines 222, the first barrier liners 242 and the second barrier liners 247 according to a step S410 in FIG. 4. The insulative film 250 covers the substrate 210 and encases the first barrier liners 242, the metallic lines 222 and the second barrier liners 247. The insulative film 250 has a topology following the topology of the substrate 210, the first barrier liners 242, the metallic lines 222 and the second barrier liners 247, and the trenches 224 are not entirely filled with the insulative material. In some embodiments, the insulative film 250 is an energy-stripping film.

Next, a passivation layer 260 is deposited to cover the insulative film 250. In some embodiments, a plurality of voids 270, holding air, can be introduced in the passivation layer 260 using a CVD process to reduce an effective dielectric of the passivation layer 260. After the deposition of the passivation layer, a thermal treatment can be performed to remove the insulative film 250, and a planarizing process can be performed on the passivation layer 260 to yield an acceptably flat topology and to form the semiconductor component 20D shown in FIG. 16.

One aspect of the present disclosure provides a semiconductor component. The semiconductor component includes a substrate, a plurality of metallic lines, a passivation layer and a spacer. The plurality of metallic lines are disposed on the substrate, the passivation layer is disposed over the substrate and the metallic lines, and the spacer is interposed between the substrate and the passivation layer and between the metallic lines and the dielectric layer. The passivation layer has a first dielectric constant, and the spacer has a second dielectric constant less than the first dielectric constant.

One aspect of the present disclosure provides a method of forming a semiconductor component. The method comprises steps of forming a plurality of metallic lines on a substrate; depositing an insulative film to cover the substrate and the metallic lines; and depositing a passivation layer to bury the insulative material. The insulative film has a topology following the topology of the substrate and the metallic lines, and the insulative film and the passivation layer have different dielectric constants.

In conclusion, with the configuration of the semiconductor component 30/30A/30B/30C, an effective dielectric constant of the dielectric layer capping the substrate 210 and the metallic lines 222 can be reduced. Therefore, the RC delay of the interconnection structure 300/300A/300B/300C, at least including the metallic liners 222 and the dielectric layer, can be reduced, and the speed of the signal transmission through the interconnection structure 300/300A/300B/300C is thus increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of forming a semiconductor component, comprising:
   forming a plurality of metallic lines on a substrate;
   depositing an insulative film to cover the substrate and the metallic lines, wherein the insulative film has a topology following the topology of the substrate and the metallic lines;
   depositing a passivation layer to bury the insulative film, wherein the insulative film and the passivation layer have different dielectric constants; and
   performing a removal process to remove the insulative film and thus creating an air spacer interposed between the substrate and the passivation layer and between the metallic lines and the passivation layer.

2. The method of claim 1, further comprising enclosing a plurality of voids in the passivation layer.

3. The method of claim 1, further comprising depositing a first barrier layer on the substrate before the forming of the metallic lines, and patterning the first barrier layer to form a plurality of first barrier liners between the substrate and the metallic lines simultaneous with the formation of the metallic lines.

4. The method of claim 1, wherein the formation of the metallic lines on the substrate comprises:
   forming a metallic layer on the substrate;
   forming a capping layer having a plurality of openings on the metallic layer; and
   etching the metallic layer through the openings to create a plurality of trenches communicating with the openings.

5. The method of claim 4, further comprising depositing a second barrier layer on the metallic layer prior to the formation of the capping layer, and patterning the second barrier layer simultaneous with the formation of the metallic lines.

6. The method of claim 4, wherein the capping layer is encased by the insulative film.

7. The method of claim 4, further comprising removing the capping layer prior to the formation of the insulative film.

8. The method of claim 1, wherein the metallic lines have sloped surfaces, and trenches between adjacent pairs of the metallic lines coated with the insulative film have a substantially uniform width.

9. A method of forming a semiconductor component, comprising:

forming a plurality of metallic lines on a substrate;

depositing an insulative film to cover the substrate and the metallic lines, wherein the insulative film has a topology following the topology of the substrate and the metallic lines;

depositing a passivation layer to bury the insulative film, wherein the insulative film and the passivation layer have different dielectric constants;

wherein the formation of the metallic lines on the substrate comprises:

forming a metallic layer on the substrate;

forming a capping layer having a plurality of openings on the metallic layer; and etching the metallic layer through the openings to create a plurality of trenches communicating with the openings.

10. The method of claim 9, further comprising depositing a second barrier layer on the metallic layer prior to the formation of the capping layer, and patterning the second barrier layer simultaneous with the formation of the metallic lines.

11. The method of claim 9, wherein the capping layer is encased by the insulative film.

12. The method of claim 9, further comprising removing the capping layer prior to the formation of the insulative film.

13. The method of claim 9, wherein the metallic lines have sloped surfaces and the trenches between adjacent pairs of the metallic lines coated with the insulative film have a substantially uniform width.

* * * * *